(12) United States Patent
Polinsky et al.

(10) Patent No.: US 7,846,776 B2
(45) Date of Patent: Dec. 7, 2010

(54) METHODS FOR RELEASABLY ATTACHING SACRIFICIAL SUPPORT MEMBERS TO MICROFEATURE WORKPIECES AND MICROFEATURE DEVICES FORMED USING SUCH METHODS

(75) Inventors: William A. Polinsky, Meridian, ID (US); Michael B. Ball, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 92 days.

(21) Appl. No.: 11/506,372

(22) Filed: Aug. 17, 2006

(65) Prior Publication Data

US 2008/0044985 A1 Feb. 21, 2008

(51) Int. Cl.
*H01L 21/00* (2006.01)
(52) U.S. Cl. .................. 438/114; 438/113; 438/459; 438/464; 438/465; 438/977; 257/E23.194
(58) Field of Classification Search ............ 438/111, 438/113, 114, 125, 459, 460, 462, 464, 465; 257/E23.194
See application file for complete search history.

(56) References Cited

U.S. PATENT DOCUMENTS

| | | | |
|---|---|---|---|
| 4,925,515 A | | 5/1990 | Yoshimura et al. |
| 5,246,737 A | | 9/1993 | Muradov |
| 5,593,926 A | * | 1/1997 | Fujihira ............... 438/114 |
| 5,656,552 A | | 8/1997 | Hudak et al. |
| 5,705,016 A | | 1/1998 | Senoo et al. |
| 6,896,760 B1 | | 5/2005 | Connell et al. |
| 2002/0089054 A1 | * | 7/2002 | Fukasawa et al. ......... 257/697 |
| 2003/0190795 A1 | * | 10/2003 | Kawakami ............. 438/462 |
| 2005/0064681 A1 | | 3/2005 | Wood et al. |
| 2006/0008650 A1 | * | 1/2006 | Wesselmann et al. .... 428/411.1 |
| 2006/0094208 A1 | * | 5/2006 | Park et al. .............. 438/460 |

FOREIGN PATENT DOCUMENTS

WO WO-2005/052994 A2 6/2005

OTHER PUBLICATIONS

Advanced Material Sciences' PDS(TM) Wafer Thinning Protection Technology Awarded the Technology Innovation Showcase Award (TIS) at SEMICON West 2006, 2 pages, Jun. 16, 2006, <http://news.tmcnet.com/news/it/-advanced-material-sciences-pdstm-wa...>.
Advanced Material Sciences, Inc., PDS™ Product Information, 1 page, Jun. 23, 2006, <http://www.advmatsci.com/producta.htm>.
Advanced Material Sciences, Inc., PDS™ Technology, 1 page, Jun. 23, 2006, <http://www.advmatsci.com/technologya.htm>.
SemiconTimes, "Breakthrough Ultra Thin Wafer Support Solution Ready For the Semiconductor Market," 2 pages, Jul. 8, 2005, <http://www.semicontimes.com/content/edit-pressrelease.asp?rec=7936>.

* cited by examiner

*Primary Examiner*—Ha Tran T Nguyen
*Assistant Examiner*—Daniel Whalen
(74) *Attorney, Agent, or Firm*—Perkins Coie LLP (57) ABSTRACT

Methods for releasably attaching sacrificial support members to microfeature workpieces and microfeature devices formed using such methods are disclosed herein. One embodiment, for example, is directed to a method for processing a microfeature workpiece releasably attached to a first support member. The workpiece includes a microelectronic substrate, a plurality of microelectronic dies on and/or in the substrate, and a sacrificial support member attached to an active side of the substrate. The method can include separating individual dies from the workpiece by cutting through the sacrificial support member and the substrate while the workpiece is attached to the first support member. The method can also include attaching a singulated die and corresponding portion of the sacrificial support member as a unit to a second support member. The method can further include removing the sacrificial support member from the die attached to the second support member with a removal solution that attacks a material of which the sacrificial support member is composed.

38 Claims, 7 Drawing Sheets

METHODS FOR RELEASABLY ATTACHING SACRIFICIAL SUPPORT MEMBERS TO MICROFEATURE WORKPIECES AND MICROFEATURE DEVICES FORMED USING SUCH METHODS

TECHNICAL FIELD

The present invention is related to methods for releasably attaching sacrificial support members to microfeature workpieces and microfeature devices formed using such methods.

BACKGROUND

Existing microelectronic device packages typically include a microelectronic die attached to a support member, such as a printed circuit board. Bond-pads or other terminals on the die are electrically connected to corresponding terminals on the support member, for example, with solder balls or wires. The connection between the die and the support member can be protected by encapsulating the die to form a device package. The package can then be electrically connected to other microelectronic devices or circuits in many types of consumer or industrial electronic products.

Manufacturers are under continuous pressure to reduce the size of the electronic products. Accordingly, microelectronic die manufacturers seek to reduce the size of the packaged dies incorporated into the electronic products. The height of the packaged dies is often reduced by grinding the back side of the wafer to thin the dies before singulating the wafer and encapsulating the dies. One drawback with this approach, however, is that thin wafers are extremely fragile and therefore difficult to handle after backgrinding.

One approach for addressing this drawback is to attach a relatively thick wafer support to the wafer for the grinding process to ensure survival of the wafer as well as to facilitate subsequent handling of the wafer for further processing. One system, for example, includes applying or laminating a generally flowable material onto an active side of the wafer and then curing the material to a desired rigidity to form the wafer support. After backgrinding, the thinned wafer is attached to a vacuum chuck and the wafer (and attached wafer support) are completely immersed into a solvent bath to dissolve or otherwise remove the wafer support. The wafer is then flipped and mounted on a dicing frame with the active side of the wafer facing downward, after which the wafer is singulated and the individual dies are removed from the dicing frame with a conventional pick-and-place apparatus. In several instances, the wafer can be mounted to the dicing frame before removal of the wafer support.

One drawback with the foregoing approach is that the thinned wafer must undergo a number of additional processing steps after the wafer support is removed. In some situations, for example, the thinned wafer (without any support) must be transferred from the vacuum chuck to the dicing frame before singulation. The thinned wafer is highly susceptible to damage and/or breakage during this transfer process. In situations where the wafer support is not removed until after the wafer is attached to the dicing frame, the wafer must still undergo singulation without any support. Moreover, the thinned, singulated dies are extremely fragile and a number of dies can be damaged and/or broken during removal from the dicing frame and subsequent handling.

Another approach for addressing this drawback is to attach a generally rigid, glass support member to the wafer to support the wafer during the grinding process and subsequent handling. The support member can be attached to the wafer using, for example, a light-activated adhesive or another suitable adhesive material. In several instances, a plurality of holes can be formed completely through the support member to expose a portion of the wafer. These holes are used to help facilitate removal of the adhesive material from the wafer. After backgrinding, the wafer support member is removed and the resulting thin wafer is ready for singulation and further processing.

This system, however, also has several drawbacks. One drawback is that the wafer support is generally removed before singulation because it is extremely difficult to cut through the glass support member during singulation. The holes through the support member further complicate the singulation process and make singulation with the glass support attached to the wafer impracticable. Accordingly, the thinned wafer must undergo singulation without any support. Another drawback with this system is that many adhesive materials can be difficult to remove from the wafer after processing. The removal process, for example, may require a number of additional processing steps involving heat and/or solvents. Accordingly, the wafer can be vulnerable to damage, contamination, and/or breakage during removal of the adhesive materials. Thus, there is a need to improve the handling of microfeature workpieces during processing.

DETAILED DESCRIPTION

A. Overview/Summary

The present invention is directed generally toward methods for releasably attaching sacrificial support members to microfeature workpieces and microfeature devices formed using such methods. One particular embodiment, for example, is directed to a method for processing a microfeature workpiece releasably attached to a first support member. The workpiece includes a microelectronic substrate, a plurality of microelectronic dies on and/or in the substrate, and a sacrificial support member attached to an active side of the substrate over the dies. The method can include separating individual dies from the workpiece by cutting through the sacrificial support member and the substrate while the workpiece is attached to the first support member. The method can then include attaching a singulated die and corresponding portion of the sacrificial support member as a unit to a second support member. The method can further include removing the sacrificial support member from the die attached to the second support member with a removal solution that attacks a material of which the sacrificial support member is composed. In several embodiments, a plurality of apertures can be formed at least partially through the sacrificial support member to help facilitate removal of the sacrificial support member from the die.

Another aspect of the invention is directed toward a microfeature assembly. One embodiment of such an assembly includes a microfeature workpiece including a microelectronic substrate having a front side, a back side, and a plurality of microelectronic dies at the front side. The assembly also includes a sacrificial support member attached to the front side of the substrate. The assembly further includes a first support member carrying the substrate and the sacrificial support member. The first support member is removably attached to the substrate to temporarily support the substrate and the sacrificial support member during singulation of the dies.

The term "microfeature workpiece" is used throughout to include substrates upon which and/or in which microelectronic circuits or components, data storage elements or layers, vias or conductive lines, micro-optic features, micromechanical features, and/or microbiological features are or can be fabricated using microlithographic techniques. For example, microfeature workpieces can be semiconductor wafers, glass substrates, insulated substrates, or many other types of substrates. The term "microfeature device" is used throughout to include microelectronic devices, micromechanical devices, data storage elements, read/write components, and other articles of manufacture. For example, microfeature devices include imagers, SIMM, DRAM, flash-memory, ASICs, processors, flip chips, ball-grid array chips, and other types of electronic devices or components. Many specific details of certain embodiments of the invention are set forth in the following description and in FIGS. 1A-2 to provide a thorough understanding of these embodiments. A person skilled in the art, however, will understand that the invention may be practiced without several of these details, and/or additional details can be added to the invention. Well-known structures and functions have not been shown or described in detail to avoid unnecessarily obscuring the description of the embodiments of the invention.

B. Embodiments of Methods for Releasably Attaching Sacrificial Support Members to Microfeature Workpieces FIGS. 1A-1J illustrate various stages in one embodiment of a method for releasably attaching a sacrificial support member to microfeature workpieces. More specifically, FIGS. 1A-1J illustrate stages of a method for releasably attaching a sacrificial support member to a front side of the workpiece and, after additional processing, removing the sacrificial support member without damaging, cracking, or otherwise breaking the microelectronic dies or other components of the workpiece.

Figure 1A:
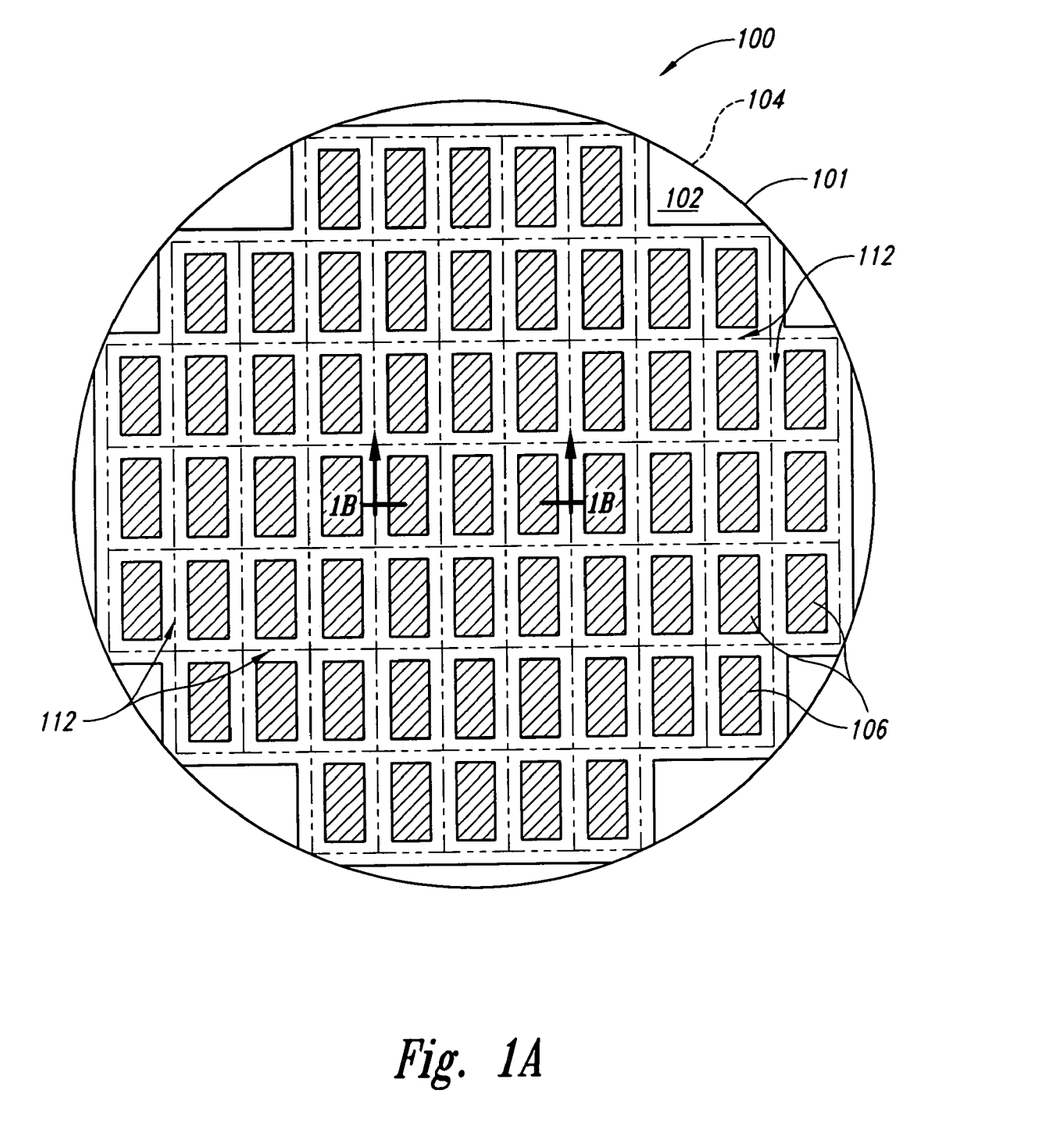
FIGS. 1A-1J illustrate various stages of a method for releasably attaching a sacrificial support member to a microfeature workpiece in accordance with an embodiment of the invention.
Figure 1B:
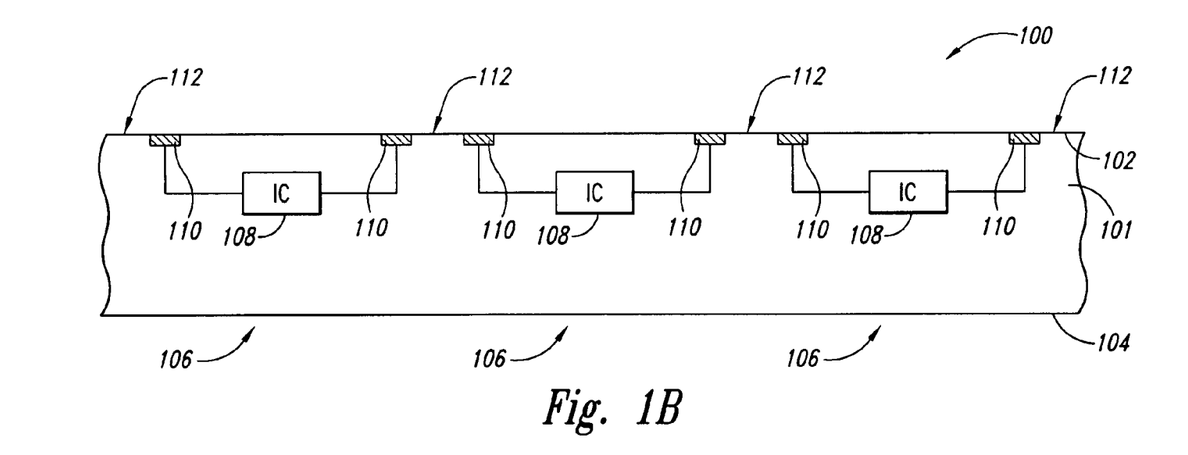

FIG. 1A is a top plan view of a microfeature workpiece 100 at an initial processing stage. At this stage, a support material which is described in detail below with respect to FIG. 1C has not yet been deposited onto the workpiece 100. FIG. 1B is a side cross-sectional view taken substantially along line 1B-1B of FIG. 1A. Referring to FIGS. 1A and 1B together, the workpiece 100 includes substrate 101 having a front or active side 102 and a back side 104 facing opposite the front side 102. The workpiece 100 further includes a plurality of microelectronic dies 106 arranged in a die pattern at the front side 102 of the substrate 101. The dies 106 can be in and/or on the substrate 101. Each die 106 can include integrated circuitry 108 (shown schematically) and a plurality of pads 110 electrically coupled to the integrated circuitry 108. In the illustrated embodiment, the pads 110 are bond-pads at the front side 102 of the substrate 101. In other embodiments, however, the pads 110 can include other types of electrical connectors and/or can be positioned at other locations on the dies 106. The dies 106 are separated from each other by a plurality of streets or scribe lanes 112. The streets 112 are generally aligned with one another to facilitate cutting with a wafer saw or another suitable device. In other embodiments, the dies 106 and/or the streets 112 can include other features and/or have other arrangements.

Figure 1C:
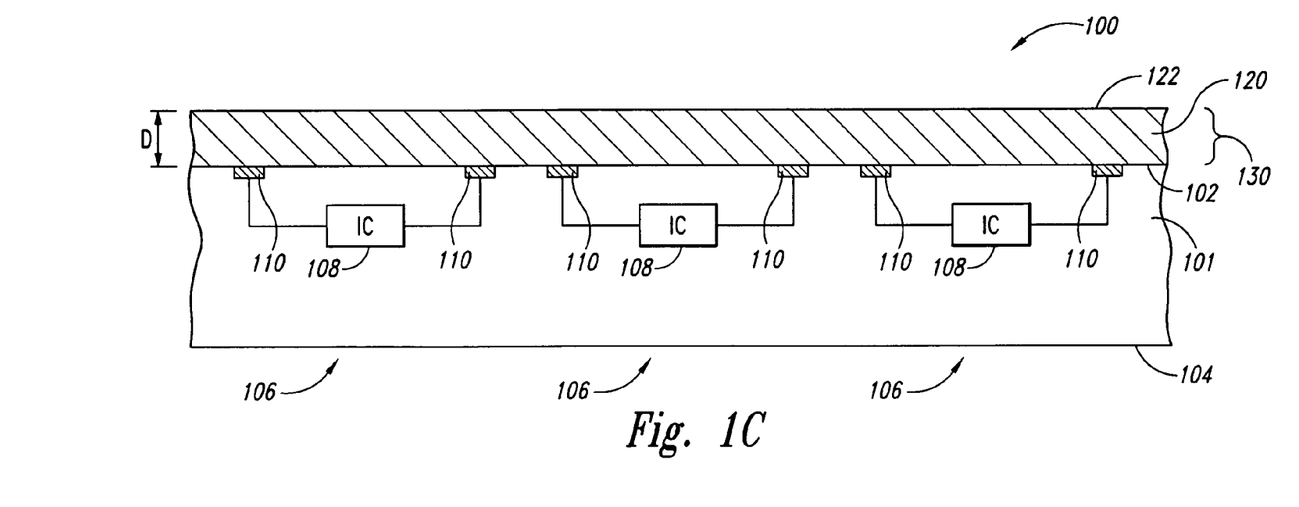

FIG. 1C is a side cross-sectional view of the workpiece 100 after a support material layer 120 has been deposited onto the front side 102 of the substrate 101. In one embodiment, for example, the support material layer 120 can be formed separately from the workpiece 100 and then one or more sheets of support material can be applied onto desired portions of the workpiece 100 to form a sacrificial support member 130 that supports the workpiece 100 to prevent breaking and/or excessive warping during subsequent processing. The sheet(s) of support material can be cured to a desired rigidity either before or after application. Alternatively, the support material layer 120 can include a flowable material that is deposited onto the front side 102 and then cured to a generally non-flowable state and a desired rigidity to form the sacrificial support member 130.

The support material layer 120 can be composed of polymeric materials, ceramics, and/or other suitable materials. In one embodiment, for example, the support material layer 120 can include a heterogenic polymer material such as PDS™ commercially available from Advanced Material Sciences of Hillsboro, Oreg. The support material layer 120 can be deposited onto the front side 102 of the workpiece 100 using spin-on techniques, screen printing processes, spraying techniques, brushing techniques, molding, a dip bath, lamination, or other suitable processes. In several embodiments, the coefficient of thermal expansion (CTE) of the sacrificial support member 130 can be at least generally similar to the CTE of the substrate 101 to help prevent excessive warping and/or undesirable relative movement between the sacrificial support member 130 and the substrate 101 during thermal processing.

The support material layer 120 has an upper surface 122 at a distance D from the front side 102 of the substrate 101. The distance D can be selected, for example, based on the desired level of support, the material used to form the support material layer 120, the thermal budget of the resulting assembly, the form factor of the processing equipment, and/or other factors. The upper surface 122 can be formed at the distance D from the front side 102 by depositing one or more sheets of support layer material 120 having a known thickness onto the substrate 101 or by planarizing the support material layer 120 after application using suitable planarization or grinding processes. In other embodiments, additional processing may also be required to form the upper surface 122 at the desired distance D from the front side 102.

Figure 1D:
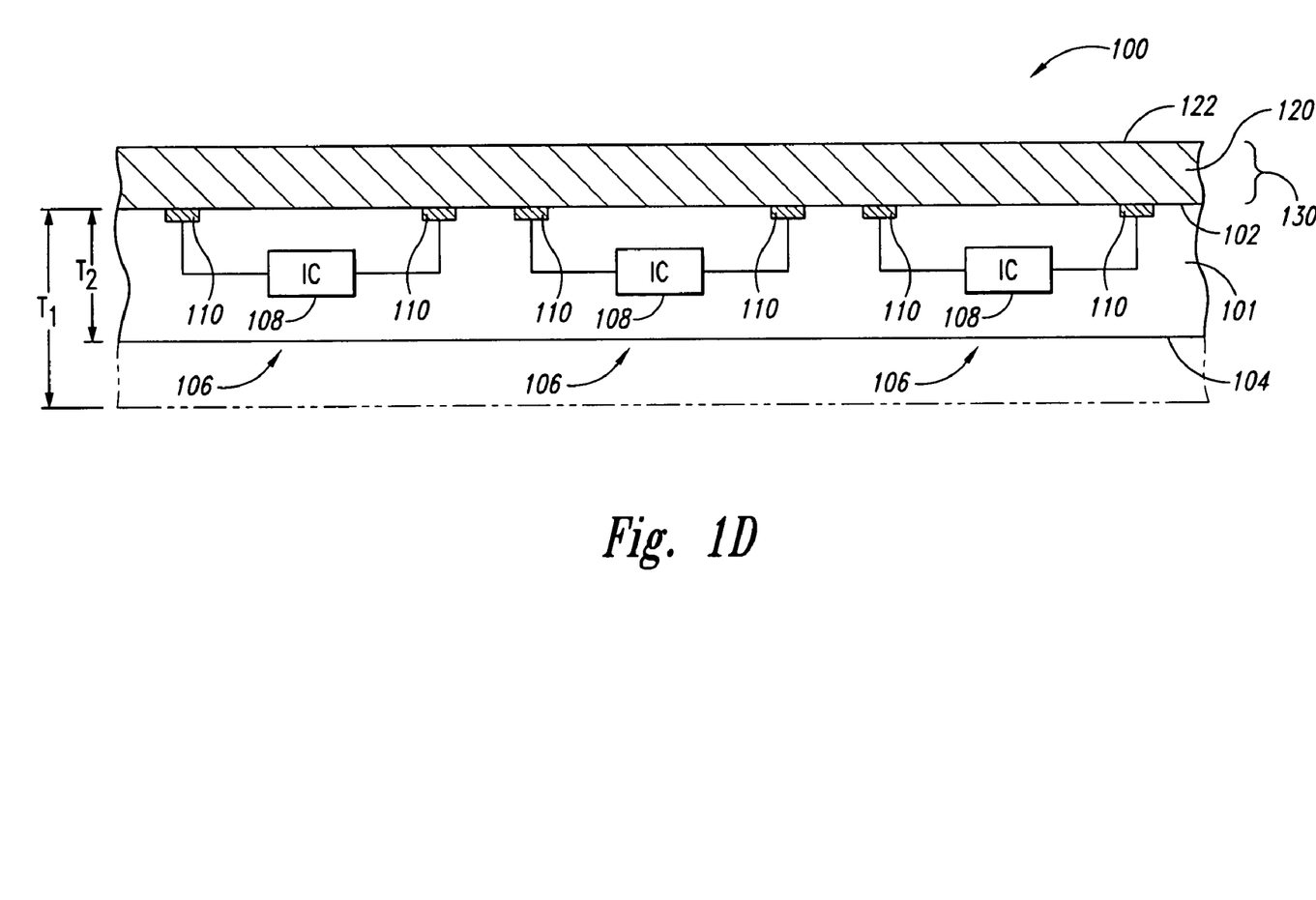

After the support material layer 120 has been deposited or attached to the front side 102 and cured (if necessary) to form the sacrificial support member 130, the workpiece 100 is ready for additional processing. In one embodiment, the additional processing can include removing material from the back side 104 of the substrate 101 to reduce its thickness. FIG. 1D, for example, is a side cross-sectional view of the workpiece 100 after thinning. More specifically, the substrate 101 has been thinned from a first thickness $T_1$ (shown in broken lines) to a second thickness $T_2$ less than the first thickness $T_1$. In one embodiment, for example, the substrate 101 can have a second thickness $T_2$ of approximately 50-100 µm. In other embodiments, however, the thinned substrate 101 can have a different second thickness $T_2$. The material can be removed from the back side 104 by grinding, etching, or other suitable processes.

After thinning, the back side 104 of the substrate 101 can undergo further processing. In one embodiment, for example, a wafer treatment (e.g., metallization, adhesive, etc.) can be applied to at least a portion of the back side 104. The application of the back side wafer treatment is an optional step that may be omitted in several embodiments.

Figure 1E:
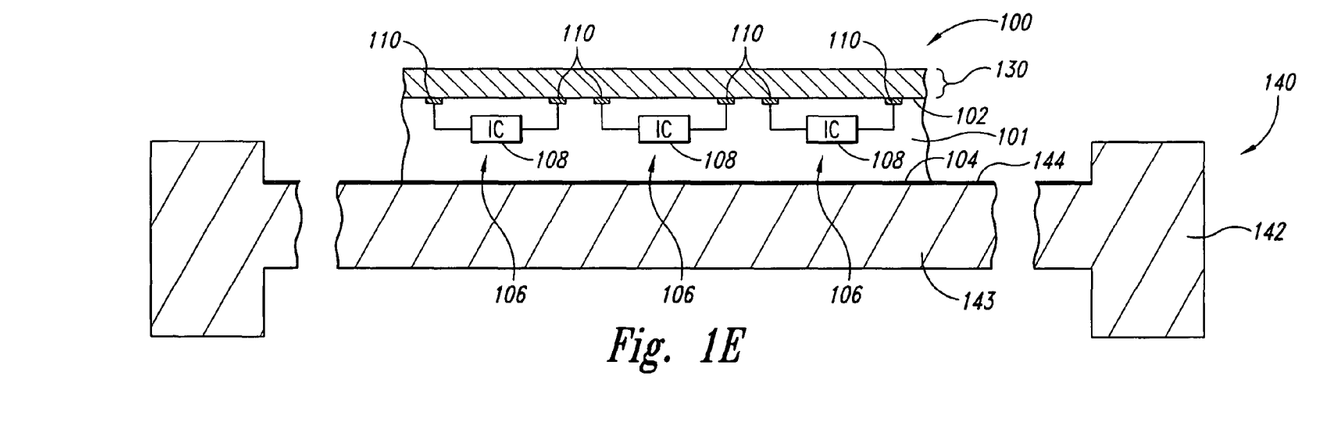

Referring next to FIG. 1E, the back side 104 of the substrate 101 can be attached to a first support member 140. In one aspect of this embodiment, the first support member 140 can include an existing dicing support having a frame 142 carrying a replaceable film 143 that can include an attachment device 144 (e.g., tape) that releasably adheres to the back side 104. Accordingly, the first support member 140 can support the back side 104, while the sacrificial support member 130 continues to provide support for the front side 102. In other embodiments, the first support member 140 can include other suitable support devices.

Figure 1F:
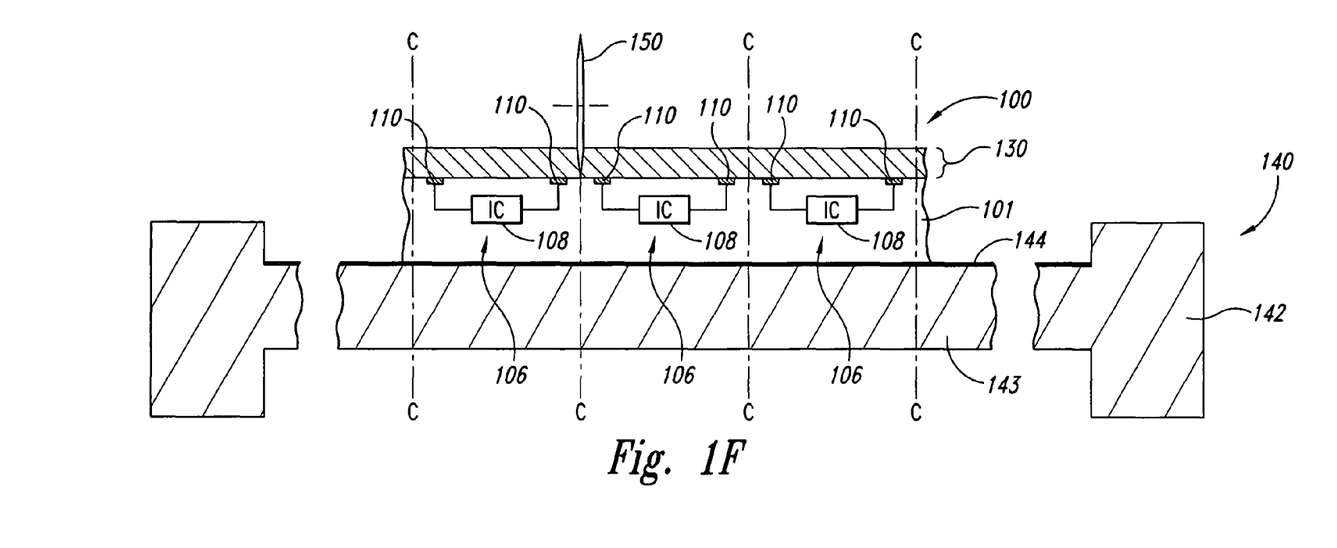

Referring next to FIG. 1F, the workpiece 100 can be cut along lines C-C to singulate the individual dies 106. The lines C-C are generally aligned with the streets 112 (FIG. 1A) between the dies 106. In one embodiment, a wafer saw or dicing blade 150 can be used to form the incisions separating the dies 106. The saw 150 can cut through the sacrificial support member 130, the substrate 101, and in some cases at least a portion of the attachment device 144. Although only a single wafer saw 150 is shown in FIG. 1F, in other embodiments two or more wafer saws can be used to singulate the dies 106. More specifically, in one embodiment a first wafer saw having a first blade coarseness can be used to cut through the sacrificial support member 130, while a second wafer saw having a second blade coarseness less than the first blade coarseness can be used to cut through the substrate 101 to singulate the dies 106.

In one aspect of this embodiment, the sacrificial support member 130 remains attached to the front or active side 102 of each die 106 both during and after singulation. One advantage of this feature is that the sacrificial support member 130 can shield the front side 102 of each die 106 from damage and/or contamination during singulation, as well as providing support for the extremely thin and fragile dies 106 during singulation and subsequent processing.

Figure 1G:
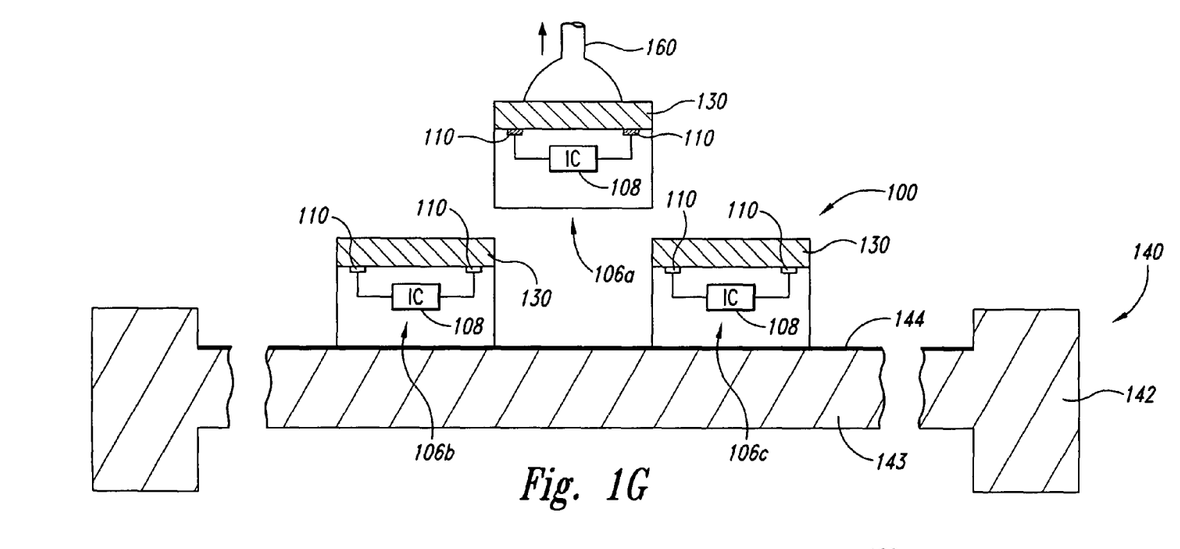

Referring now to FIG. 1G, a conventional pick-and-place apparatus 160 can be used to remove a first die 106a from the first support member 140. In the illustrated embodiment, the attachment device 144 remains attached to the film 143 so that no portion of the attachment device 144 is removed with the first die 106a. In another embodiment, however, at least a portion of the attachment device 144 can be removed along with the first die 106a and can later be removed from the first die 106a in a separate step. In either embodiment, the first die 106a can be removed from the first support member 140 while a second die 106b and a third die 106c remain proximate to the first support member 140. The foregoing removal process can then be repeated for the second die 106b, the third die 106c, and other dies 106. In several embodiments, a release agent (e.g., ultraviolet radiation) may be used to facilitate removal of the dies 106 from the attachment device 144.

Figure 1H:
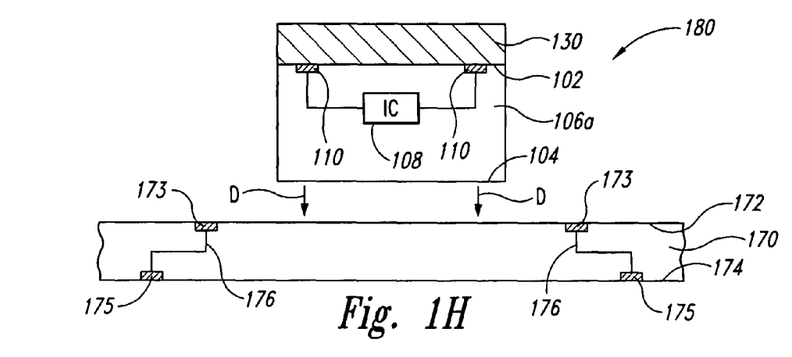

Referring next to FIG. 1H, one or more singulated dies 106 (e.g., the first die 106a) can be attached to a second support member 170 (e.g., a lead frame, interposer substrate, circuit board, flex tape, or the like) to form a microfeature device 180. In the illustrated embodiment, the second support member 170 includes a first side 172 having a plurality of first contact pads 173 and a second side 174 having a plurality of second contact pads 175. A plurality of traces 176 extend through the second support member 170 to electrically couple the first contact pads 173 to corresponding second contact pads 175. An epoxy, tape, or other suitable adhesive material (not shown) can be used to attach the back side 104 of the die 106a to the first side 172 of the second support member 170 (as shown by arrows D). If necessary, the adhesive material between the die 106a and the second support member 170 can be cured before further processing.

Figure 1I:
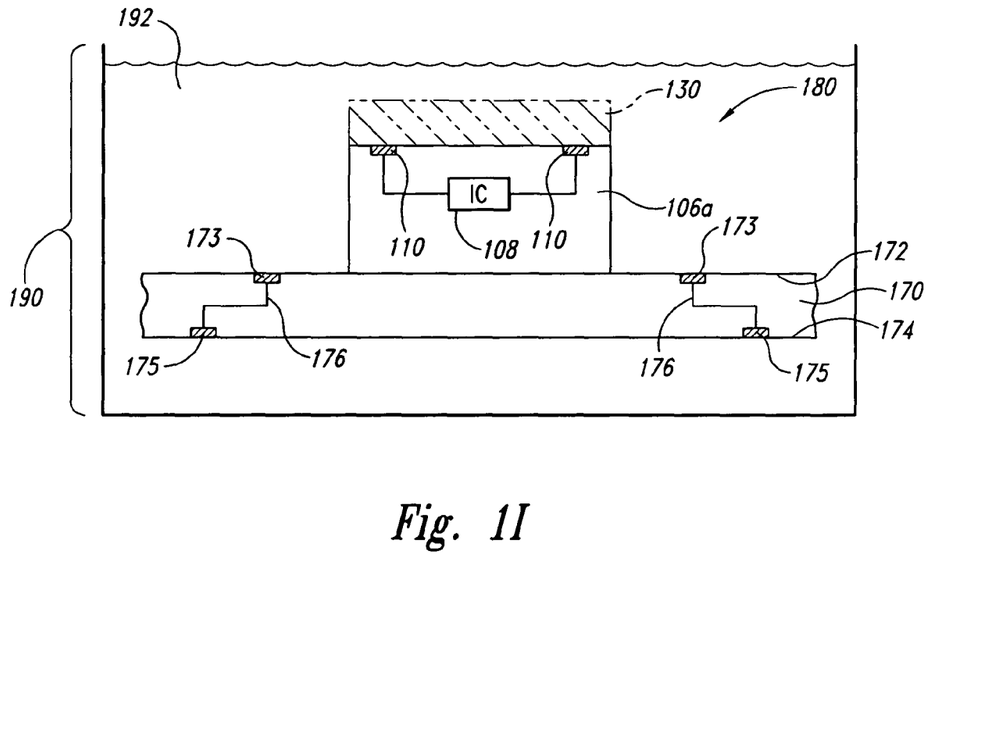

Referring now to FIG. 1I, the device 180 is exposed to a removal solution to remove the sacrificial support member 130 from the die 106a. In the illustrated embodiment, for example, the device 180 is placed in a dip bath 190 including a solvent 192 (e.g., an acetone material) that attacks a material of which the sacrificial support member 130 is composed (i.e., the support material layer 120 (FIG. 1C)). The sacrificial support member 130 can include multiple constituents, and the solvent 192 can attack some or all of the constituents. The solvent 192 at least partially dissolves the sacrificial support member 130 such that the sacrificial support member 130 is removed from the device 180, leaving the die 106a and second support member 170 ready to undergo further processing. It should be understood that when removing the sacrificial support member 130 from the die 106a, residue from the sacrificial support member 130 may remain on the die 106a in some instances. Thus, in several embodiments the device 180 can optionally undergo one or more additional post-processing steps to remove any residual portions of the sacrificial support member 130 from die 106a after removing the device 180 from the dip bath 190.

In other embodiments, other types of removal solutions can be used to remove the sacrificial support member 130 from the device 180. The removal solutions, for example, can include aqueous or non-aqueous solutions that attack the material of which the sacrificial support member 130 is composed. Accordingly, the selection of an appropriate removal solution is largely based on the type of material used to form the sacrificial support member 130. In still other embodiments, the removal solution can be applied or otherwise disposed onto the sacrificial support member 130 using a number of different methods (e.g., spraying processes, brushing techniques, etc.) in addition to, or in lieu of, the dip bath 190.

Figure 1J:
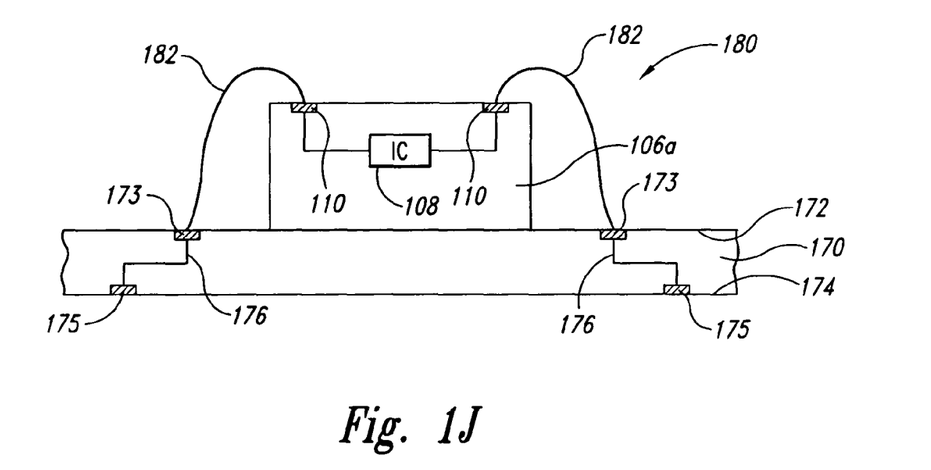

Referring next to FIG. 1J, the device 180 is ready for additional processing and/or handling. In the illustrated embodiment, for example, the die 106a can be electrically coupled to the second support member 170 with a plurality of wire bonds 182 or other types of connectors extending between the pads 110 and corresponding first contact pads 173 on the second support member 170. As such, the second support member 170 distributes signals from the very small pads 110 on the die 106a to the larger array of second contact pads 175 at the second side 174 of the second support member 170. In other embodiments, the device 180 can undergo other types of processing (e.g., encapsulation, etc.).

One feature of embodiments of the method described above with reference to FIGS. 1A-1J is that the sacrificial support member 130 can remain attached to the substrate 101 as the substrate is thinned, attached to the first support member 140, singulated, and as one or more individual dies 106 are subsequently attached to the second support member 170 for additional processing. An advantage of this feature is that the workpiece 100 is less likely to be damaged or broken as it is transferred from a grinder or other thickness-reducing tool to the first support member 140. In addition, the sacrificial support member 130 is expected to enable extremely thin dies (e.g., dies having a thickness of approximately 50-100 µm) to survive removal (e.g., the "die pick" procedure) from the first support member 140 after singulation. The sacrificial support member 130 accordingly provides support to the substrate 101 and resulting dies 106 throughout processing until after the dies 106 are attached to the second support member 170.

Another feature of embodiments of the method described above is that the removal solution can relatively quickly and easily remove the sacrificial support member 130 by attacking the material of which the sacrificial support member 130 is composed. As discussed previously, for example, the removal solution can include aqueous or non-aqueous solvents that completely or substantially dissolve away the sacrificial support member 130 without damaging or negatively affecting the other components of the device 180. One advantage of this feature is that the device 180 does not generally require any post-processing cleaning to remove support member residue from the device 180. Another advantage of this feature is that it can increase throughput and reduce costs as compared with conventional processes that require time-consuming processes and expensive solvents for removing temporary support members.

Still another feature of embodiments of the method described above is that the sacrificial support member 130 is releasably attached over all or substantially all of the front side 102 of the substrate 101. An advantage of this feature is that the die features at the front side 102 are less likely to be damaged as the workpiece 100 is processed because the sacrificial support member 130 provides support and protection. For example, the sacrificial support member 130 can shield the sensitive and delicate components of the dies 106 from incidental contact with surrounding tools, machinery, and/or other components.

Figure 2:
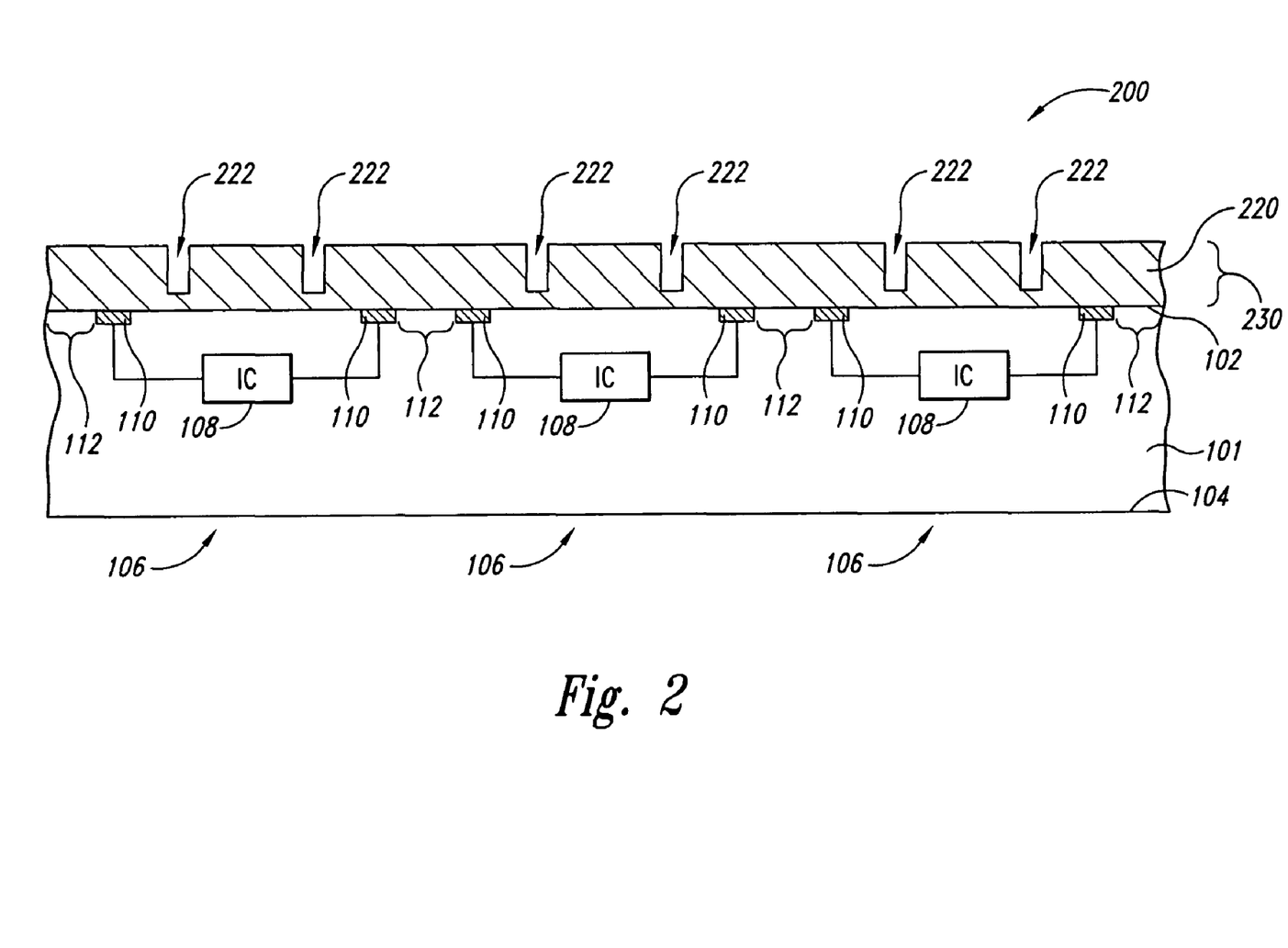
FIG. 2 illustrates a stage in a method for releasably attaching a sacrificial support member to a microfeature workpiece in accordance with another embodiment of the invention.

C. Additional Embodiments of Methods for Releasably Attaching Sacrificial Support Members to Microfeature Workpieces FIG. 2 illustrates a stage in a method for releasably attaching a sacrificial support member to a microfeature workpiece in accordance with another embodiment of the invention. More specifically, FIG. 2 is a side cross-sectional view of a workpiece 200 after a support material layer 220 has been deposited onto the workpiece. This stage of the method differs from the stage described above with respect to FIG. 1C in that after depositing the support material layer 220, a plurality of apertures 222 are formed in the support material layer 220. In the illustrated embodiment, for example, the apertures 222 are relatively small openings that only extend partially through the support material layer 220. In other embodiments, however, the apertures 222 can include openings having different sizes or arrangements, perforations, channels, trenches, or other types of openings that extend either partially through the support material layer 220 or completely through the support material layer 220 to the front side 102 of the substrate 101. The apertures 222 can be formed either before or after the support material layer 220 is cured. Furthermore, in cases where the support material layer 220 is a separate component that is attached to the workpiece 200, the apertures 222 can be formed in the support material layer 220 either before or after attachment. After forming the apertures 222, the workpiece 200 can undergo additional processing steps that are at least generally similar to those described above with reference to FIGS. 1D-1J.

In one particular aspect of this embodiment, the apertures 222 are not aligned with the streets 112 between the individual dies 106. One advantage of this feature is that the apertures 222 will not interfere with or otherwise affect the singulation process described above with reference to FIG. 1F. In other embodiments, however, one or more of the apertures 222 may be aligned with at least a portion of the streets 112.

One feature of the apertures 222 extending at least partially through the support material layer 220 (and a resulting sacrificial support member 230 after curing of the support material layer 220) is that the apertures 222 increase the surface area of the sacrificial support member 230 and, accordingly, facilitate faster removal of the sacrificial support member 230 with the removal solution. The apertures 222, for example, are expected to increase the rate at which the solvent bath (FIG. 1I) dissolves the sacrificial support member 230 during processing. One advantage of this feature is that it can increase throughput of processed devices because it will take less time to remove the sacrificial support member 230 from each device.

From the foregoing, it will be appreciated that specific embodiments of the invention have been described herein for purposes of illustration, but that various modifications may be made without deviating from the invention. For example, the sacrificial support member can be composed of other materials than those described above, and the solvent used to remove the sacrificial support member can be specifically tailored to attack some or all of the materials from which the sacrificial support member is composed. Aspects of the invention described in the context of particular embodiments may be combined or eliminated in other embodiments. Further, while advantages associated with certain embodiments of the invention have been described in the context of those embodiments, other embodiments may also exhibit such advantages, and not all embodiments need necessarily exhibit such advantages to fall within the scope of the invention. Accordingly, the invention is not limited except as by the appended claims.

We claim:

1. A method for processing a microfeature workpiece releasably attached to a first support member, the workpiece including a microelectronic substrate, a plurality of microelectronic dies on and/or in the substrate, and a sacrificial support member attached to an active side of the substrate over the dies, wherein the sacrificial support member comprises a plurality of openings extending at least partially through the sacrificial support member, and wherein the openings are formed before attaching the sacrificial support member to the active side of the substrate, the method comprising:

separating individual dies from the workpiece by cutting through the sacrificial support member and the substrate while the workpiece is attached to the first support member;

attaching a singulated die and corresponding portion of the sacrificial support member as a unit to a second support member; and removing the sacrificial support member from the die attached to the second support member with an aqueous removal solution that attacks a material of which the sacrificial support member is composed.

2. The method of claim 1 wherein removing the sacrificial support member from the die attached to the second support member with a removal solution comprises at least partially immersing the die and second support member into a bath of removal solution.

3. The method of claim 2 wherein removing the sacrificial support member from the die attached to the second support member with a removal solution comprises at least partially immersing the die and second support member into a bath including an acetone material.

4. The method of claim 1 wherein removing the sacrificial support member from the die attached to the second support member with a removal solution comprises disposing the removal solution onto at least a portion of the sacrificial support member using a spraying process.

5. The method of claim 1 wherein removing the sacrificial support member with a removal solution comprises dissolving at least approximately all the sacrificial support member.

6. The method of claim 1 wherein removing the sacrificial support member with a removal solution comprises dissolving a portion of the sacrificial support member such that the bond between the die and the sacrificial support member fails and the remaining portion of the sacrificial support member is removed from the die.

7. The method of claim 1 wherein the individual dies include integrated circuitry and pads electrically coupled to the integrated circuitry, and wherein the method further comprises forming a plurality of wire bonds between the pads on the die and corresponding contact pads on the second support member after removing the sacrificial support member from the die.

8. The method of claim 1 wherein attaching a singulated die and corresponding portion of the sacrificial support member as a unit to a second support member comprises attaching a singulated die to a lead frame, an interposer substrate, a circuit board, or flex tape.

9. The method of claim 1 wherein separating individual dies from the workpiece while the workpiece is attached to the first support member comprises separating individual dies from the workpiece while the workpiece is attached to a dicing frame.

10. The method of claim 1 wherein attaching a singulated die and corresponding portion of the sacrificial support member as a unit to a second support member comprises attaching the die to the second support member with an adhesive material.

11. The method of claim 10 wherein attaching the die to the second support member with an adhesive material comprises (a) attaching the die to the second support member with an epoxy material, and (b) at least partially curing the epoxy material before removing at least approximately all the sacrificial support member from the die.

12. The method of claim 1 wherein separating individual dies from the workpiece by cutting through the sacrificial support member and the substrate includes:
cutting through the sacrificial support member with a first wafer saw having a first blade coarseness; and
cutting through the substrate with a second wafer saw having a second blade coarseness less than the first blade coarseness.

13. The method of claim 1 wherein the sacrificial support member comprises one or more sheets of support material formed separately from the substrate and applied onto desired portions on the active side of the substrate before separating the individual dies.

14. A method for processing a microfeature workpiece having a substrate and a plurality of microelectronic dies on and/or in the substrate, the individual dies including integrated circuitry and pads electrically coupled to the integrated circuitry, the method comprising:
attaching a sacrificial support member to an active side of the substrate and over the dies, wherein the sacrificial support member comprises a plurality of apertures extending at least partially through the sacrificial support member, and wherein the apertures are formed in the sacrificial support member before attaching the sacrificial support member to the active side of the substrate;
releasably attaching a back side of the substrate to a dicing frame;
separating individual dies from the workpiece by cutting through the sacrificial support member and the substrate while the substrate is attached to the dicing frame;
removing the singulated dies and corresponding portions of the sacrificial support member from the dicing frame;
adhesively attaching one or more singulated dies to a support member; and
removing the sacrificial support member from each die attached to the support member with a solvent that attacks a material of which the sacrificial support member is composed.

15. The method of claim 14, further comprising removing material from the back side of the substrate to thin the substrate after attaching the sacrificial support member to the active side and before releasably attaching the back side to the dicing frame.

16. The method of claim 15 wherein removing material from a back side of the substrate to thin the substrate includes thinning the substrate to a thickness of approximately 50-100 μm.

17. The method of claim 15, further comprising applying a wafer treatment to the back side of the substrate after removing material from the back side and before releasably attaching the back side to the dicing frame.

18. The method of claim 14 wherein attaching a sacrificial support member to an active side of the substrate and over the dies comprises attaching a generally rigid, sacrificial support member to the active side of the substrate with an adhesive material.

19. The method of claim 14 wherein attaching a sacrificial support member to the active side of the substrate and over the dies comprises attaching a sacrificial support member having a coefficient of thermal expansion (CTE) at least generally similar to the CTE of the substrate.

20. The method of claim 14 wherein the individual dies on and/or in the substrate are separated from each other by a plurality of streets, and wherein:
attaching a sacrificial support member to an active side of the substrate comprises attaching a sacrificial support member having apertures that extend only partially through the sacrificial support member and are out of alignment with the streets between the individual dies.

21. The method of claim 14 wherein removing the sacrificial support member from each die attached to the support member with a solvent comprises selecting a solvent that does not generally affect the bond between the individual dies and the support member.

22. The method of claim 14 wherein removing the sacrificial support member from each die attached to the support member with a solvent comprises at least partially immersing the one or more dies and support member into a solvent bath.

23. The method of claim 22 wherein removing the sacrificial support member from each die attached to the support member with a solvent comprises at least partially immersing the one or more dies and support member into a bath of acetone material.

24. The method of claim 22 wherein removing the sacrificial support member from each die attached to the support member with a solvent comprises disposing the solvent onto the sacrificial support member carried by the one or more dies using a spraying process.

25. The method of claim 14 wherein removing the sacrificial support member from each die attached to the support member with a solvent comprises dissolving at least approximately all the sacrificial support member from each die.

26. The method of claim 14 wherein removing the sacrificial support member from each die attached to the support member with a solvent comprises dissolving a portion of the sacrificial support member from each die such that the bond between the die and the sacrificial support member fails and the remaining portion of the sacrificial support member is removed from the die.

27. The method of claim 14 wherein adhesively attaching one or more singulated dies to a support member comprises attaching one or more dies to a lead frame, an interposer substrate, a circuit board, or flex tape.

28. The method of claim 14 wherein adhesively attaching one or more singulated dies to a support member comprises (a) attaching the one or more dies to the second support member with an epoxy material, and (b) at least partially curing the epoxy material before removing the sacrificial support member from each die.

29. The method of claim 14, further comprising forming a plurality of wire bonds between the pads on the one or more dies attached to the support member and corresponding contact pads on the support member after removing the sacrificial support member from each die with the solvent.

30. A method for forming a microfeature device, the method comprising:
   supporting a front side of a microfeature workpiece with a sacrificial support member, the workpiece including a plurality of microelectronic dies;
   removing material from a back side of the workpiece to thin the workpiece from a first thickness to a second thickness less than the first thickness while the workpiece is supported by the sacrificial support member;
   temporarily supporting the workpiece and the sacrificial support member with a first support member positioned proximate to the back side of the workpiece;
   forming a plurality of openings extending partially through the sacrificial support member;
   while the workpiece is temporarily supported by the first support member and after forming the plurality of openings extending partially through the sacrificial support member, cutting through the sacrificial support member and the workpiece to separate the individual dies from each other;
   adhesively attaching a singulated die and corresponding portion of the sacrificial support member as a unit to a second support member;
   exposing the die and corresponding portion of the sacrificial support member to an aqueous removal solution that attacks a material of which the sacrificial support member is formed to remove at least approximately all the sacrificial support member from the die; and
   electrically coupling the die to the second support member after removing at least approximately all the sacrificial support member.

31. The method of claim 30 wherein removing material from a back side of the workpiece to thin the workpiece includes thinning the workpiece to a thickness of approximately 50-100 μm.

32. The method of claim 30 wherein exposing the die and corresponding portion of the sacrificial support member to a removal solution comprises at least partially immersing the die and sacrificial support member into a solvent bath.

33. The method of claim 30 wherein exposing the die and corresponding portion of the sacrificial support member to a removal solution comprises exposing the die and sacrificial support member to a removal solution that does not generally affect the bond between the die and the second support member.

34. The method of claim 30, wherein forming a plurality of openings extending partially through the sacrificial support member comprises forming a plurality of openings out of alignment with a plurality of streets between the individual dies.

35. The method of claim 30 wherein adhesively attaching a singulated die and corresponding portion of the sacrificial support member as a unit to a second support member comprises attaching one or more dies to a lead frame, an interposer substrate, a circuit board, or flex tape.

36. The method of claim 30 wherein the die includes integrated circuitry and pads electrically coupled to the integrated circuitry, and wherein:
   electrically coupling the die to the second support member comprises forming a plurality of wire bonds between the pads on the die and corresponding contact pads on the second support member after removing at least approximately all the sacrificial support member.

37. A method for processing a microfeature workpiece, the method comprising:
   providing a microfeature workpiece including (a) a microelectronic substrate with a front side and a back side, (b) a plurality of microelectronic dies at the front side of the substrate, and (c) a sacrificial support member attached to the front side over the dies, wherein the sacrificial support member comprises a plurality of preformed apertures extending at least partially through the sacrificial support member, and wherein the apertures are formed before the sacrificial support member is attached to the front side of the substrate over the dies;
   cutting through the sacrificial support member and substrate to singulate the dies;
   attaching a singulated die and corresponding portion of the sacrificial support member to a support member with an adhesive material; and
   removing the portion of the sacrificial support member from the die with a solvent that at least partially dissolves the sacrificial support member such that the bond between the sacrificial support member and the die fails without generally affecting the adhesive bond between the die and the support member.

38. The method of claim 37 wherein attaching a singulated die and corresponding portion of the sacrificial support member to a support member comprises attaching the die to a lead frame, an interposer substrate, a circuit board, or flex tape.

* * * * *